(12) United States Patent
Oh et al.

(10) Patent No.: US 11,217,298 B2
(45) Date of Patent: Jan. 4, 2022

(54) DELAY-LOCKED LOOP CLOCK SHARING

(71) Applicant: Micron Technology, Inc., Boise, ID (US)

(72) Inventors: Younghoon Oh, McKinney, TX (US); Michael V. Ho, Allen, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 16/817,095

(22) Filed: Mar. 12, 2020

(65) Prior Publication Data

US 2021/0287731 A1    Sep. 16, 2021

(51) Int. Cl.
| G11C 11/4076 | (2006.01) |
| G11C 11/4096 | (2006.01) |
| H03L 7/081 | (2006.01) |
| G11C 7/10 | (2006.01) |
| G11C 11/4093 | (2006.01) |

(52) U.S. Cl.
CPC ........ *G11C 11/4076* (2013.01); *G11C 7/1051* (2013.01); *G11C 11/4093* (2013.01); *G11C 11/4096* (2013.01); *H03L 7/0812* (2013.01)

(58) Field of Classification Search
CPC .............. G11C 11/4076; G11C 7/1051; G11C 11/4093; G11C 11/4096; H03L 7/0812
USPC ............................................... 365/194, 233.5
See application file for complete search history.

(56) References Cited

U.S. PATENT DOCUMENTS

| 3,626,385 | A | * | 12/1971 | Bouman | G05B 19/4181 |
| | | | | | 700/159 |
| 6,437,619 | B2 | * | 8/2002 | Okuda | G11C 7/1051 |
| | | | | | 327/156 |
| 7,065,665 | B2 | * | 6/2006 | Jacobson | G06F 1/3237 |
| | | | | | 713/400 |
| 7,069,458 | B1 | * | 6/2006 | Sardi | H03L 7/0996 |
| | | | | | 327/152 |
| 7,366,941 | B1 | * | 4/2008 | Norman | G06F 1/10 |
| | | | | | 713/400 |
| 7,590,211 | B1 | * | 9/2009 | Burney | H03L 7/0995 |
| | | | | | 375/376 |
| 7,821,850 | B2 | * | 10/2010 | Suzuki | H03K 19/0185 |
| | | | | | 365/189.11 |
| 8,085,074 | B1 | * | 12/2011 | Janardhanan | H03L 7/10 |
| | | | | | 327/158 |
| 8,624,643 | B2 | * | 1/2014 | Choi | H03L 7/0812 |
| | | | | | 327/158 |
| 9,197,202 | B2 | * | 11/2015 | Jang | H03K 5/131 |
| 10,163,486 | B1 | * | 12/2018 | Gajapathy | G11C 11/408 |
| 10,290,255 | B2 | * | 5/2019 | Wu | G09G 3/2003 |

(Continued)

*Primary Examiner* — Michael T Tran
(74) *Attorney, Agent, or Firm* — Fletcher Yoder, P.C.

(57) ABSTRACT

An apparatus includes a memory device interface comprising a first data output, a second data output, a third data output, and a fourth data output, as well as a first path corresponding to the first data output, a second path corresponding to the second data output, a third path corresponding to the third data output, and a fourth path corresponding to the fourth data output. The apparatus also includes a signal transmission circuit comprising a first output that when in operation transmits a first clock signal to the first path, the second path, the third path, and the fourth path and a second output that when in operation transmits a second clock signal to the first path, the second path, the third path, and the fourth path.

20 Claims, 4 Drawing Sheets

(56) References Cited

U.S. PATENT DOCUMENTS

| | | | |
|---|---|---|---|
| 10,395,702 B1* | 8/2019 | Brown | G11C 7/225 |
| 10,489,314 B2* | 11/2019 | Solomon | G11C 7/1072 |
| 10,522,208 B1* | 12/2019 | Morishige | G06F 1/10 |
| 10,637,488 B1* | 4/2020 | Im | G06F 1/10 |
| 10,651,836 B1* | 5/2020 | Kale | H03K 23/54 |
| 10,840,938 B2* | 11/2020 | Watanabe | H03M 1/645 |
| 2001/0056332 A1* | 12/2001 | Abrosimov | G11C 7/222 702/89 |
| 2002/0059536 A1* | 5/2002 | Saeki | H03L 7/00 713/500 |
| 2003/0155953 A1* | 8/2003 | Hirata | H03L 7/0814 327/236 |
| 2003/0201927 A1* | 10/2003 | Watanabe | G04F 10/005 341/157 |
| 2004/0041769 A1* | 3/2004 | Yamashita | G09G 3/3677 345/93 |
| 2004/0203559 A1* | 10/2004 | Stojanovic | H04L 25/063 455/403 |
| 2005/0156859 A1* | 7/2005 | Jang | G11C 19/184 345/100 |
| 2006/0220697 A1* | 10/2006 | Flynn | H03K 23/68 327/105 |
| 2007/0069782 A1* | 3/2007 | Shin | H03L 7/0816 327/158 |
| 2007/0079191 A1* | 4/2007 | Shin | G11C 19/184 714/726 |
| 2007/0240012 A1* | 10/2007 | Burney | G06F 1/10 713/500 |
| 2007/0297559 A1* | 12/2007 | Cho | G09G 3/3677 377/64 |
| 2008/0098251 A1* | 4/2008 | Naujokat | G11C 7/22 713/401 |
| 2008/0116949 A1* | 5/2008 | Nair | H03L 7/0805 327/158 |
| 2008/0201597 A1* | 8/2008 | Chong | G11C 7/1066 713/401 |
| 2009/0146700 A1* | 6/2009 | Kim | H03L 7/07 327/144 |
| 2010/0073053 A1* | 3/2010 | Shin | H03L 7/0814 327/158 |
| 2010/0102860 A1* | 4/2010 | Kim | H03L 7/0814 327/158 |
| 2010/0117692 A1* | 5/2010 | Yoon | H03K 5/13 327/144 |
| 2010/0164566 A1* | 7/2010 | Ku | H03L 7/0812 327/149 |
| 2010/0231281 A1* | 9/2010 | Douskey | G06F 1/04 327/291 |
| 2010/0271092 A1* | 10/2010 | Zerbe | G06F 1/04 327/161 |
| 2011/0004774 A1* | 1/2011 | Hansquine | G06F 1/3203 713/310 |
| 2011/0148486 A1* | 6/2011 | Mosalikanti | H03K 5/15 327/158 |
| 2011/0234278 A1* | 9/2011 | Seo | H03L 7/0814 327/158 |
| 2011/0235459 A1* | 9/2011 | Ware | G06F 3/0673 365/233.11 |
| 2011/0249774 A1* | 10/2011 | Thakkar | H04L 25/03063 375/316 |
| 2012/0007645 A1* | 1/2012 | Park | H03L 7/0818 327/158 |
| 2012/0099859 A1* | 4/2012 | Watanabe | H04Q 11/0005 398/45 |
| 2012/0311251 A1* | 12/2012 | Best | G06F 3/0683 711/105 |
| 2013/0120036 A1* | 5/2013 | Zhu | H04L 7/0276 327/156 |
| 2013/0182516 A1* | 7/2013 | Kinoshita | G11C 8/18 365/194 |
| 2013/0207698 A1* | 8/2013 | Chae | G06F 1/10 327/144 |
| 2013/0214826 A1* | 8/2013 | Dahan | G06F 1/04 327/115 |
| 2013/0214833 A1* | 8/2013 | Kim | G11C 7/1066 327/156 |
| 2013/0249612 A1* | 9/2013 | Zerbe | G11C 7/222 327/161 |
| 2013/0342251 A1* | 12/2013 | Patel | H03L 7/0805 327/158 |
| 2014/0028364 A1* | 1/2014 | Venkatraman | G06F 1/206 327/262 |
| 2014/0118033 A1* | 5/2014 | Anker | H03K 5/1252 327/142 |
| 2014/0258765 A1* | 9/2014 | Persson | G06F 1/10 713/501 |
| 2015/0054558 A1* | 2/2015 | Jang | H03K 5/131 327/250 |
| 2015/0078495 A1* | 3/2015 | Hossain | H04L 27/0014 375/346 |
| 2015/0222379 A1* | 8/2015 | Hauenschild | H04J 3/0685 370/518 |
| 2017/0155390 A1* | 6/2017 | Zhang | H03K 19/01855 |
| 2017/0219643 A1* | 8/2017 | Kim | G01R 29/26 |
| 2018/0026781 A1* | 1/2018 | Otte | H03M 1/0673 375/355 |
| 2018/0175839 A1* | 6/2018 | Bandi | H03L 7/091 |
| 2018/0183633 A1* | 6/2018 | Ho | H04L 7/033 |
| 2019/0095105 A1* | 3/2019 | Gajapathy | G06F 15/76 |
| 2019/0371376 A1* | 12/2019 | Kim | G11C 7/109 |
| 2020/0014389 A1* | 1/2020 | Chang | H03L 7/23 |
| 2020/0059226 A1* | 2/2020 | Choi | G11C 7/222 |
| 2020/0105317 A1* | 4/2020 | Venkatram | G11C 7/1075 |
| 2020/0204189 A1* | 6/2020 | Watanabe | H03M 1/60 |
| 2021/0241805 A1* | 8/2021 | Penney | G11C 11/4096 |
| 2021/0241813 A1* | 8/2021 | Penney | H03K 3/037 |
| 2021/0241815 A1* | 8/2021 | Park | G11C 11/4096 |
| 2021/0287731 A1* | 9/2021 | Oh | H03L 7/0812 |

\* cited by examiner

DELAY-LOCKED LOOP CLOCK SHARING

BACKGROUND

Field of the Present Disclosure

Embodiments of the present disclosure relate generally to the field of semiconductor devices. More specifically, embodiments of the present disclosure relate to delay-locked loop (DLL) clock sharing to reduce power consumption in a memory device.

Description of Related Art

In semiconductor devices such as semiconductor memory, proper operation of the memory device is based on the correct timing and synchronization of various internal command and clock signals. For example, in reading data from the memory device, internal clock signals that clock data path circuitry to provide (e.g. output) the read data should be provided substantially concurrently with internal read command signals to properly enable the data path circuitry to output the read data. If the timing of the internal read command signal is not such that the data path circuitry is enabled at the time the internal clock signal clocks the data path circuitry to output the read data at an expected time, the read command may be inadvertently ignored or the read data provided by the memory may not be correct (e.g., the data associated with another read command). Likewise, in writing data to the memory device, internal clock signals that clock data path circuitry to latch write data should be provided with specific timing relationships with internal write command signals to properly enable the data path circuitry to provide the latched write data for writing to the memory device. Inaccurate timing of the internal command and clock signals could result in the write command being inadvertently ignored or incorrect write data being provided to the memory device (e.g., the write data is associated with the wrong write command).

To facilitate proper timing of clocks, a clock circuit may include a delay-locked loop (DLL) to generate one or more modified clock signals. However, as more memory banks are placed onto a memory device, there is a need for a reduction in size of the components used to provide functionality to the memory of the memory device, including components used to provide the DLL clocks to the memory device. Additionally, with the increase in memory banks in a memory devices, reduction in power consumption becomes increasingly important. Embodiments of the present disclosure may be directed to one or more of the problems set forth above.

DETAILED DESCRIPTION

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

Memory devices may use circuitry and techniques to synchronize various internal signals with an internal clock to facilitate functionality of the memory device through various modes of operation. For instance, in synchronous dynamic random access memory (SDRAM), such as double data rate type four SDRAM (DDR4 SDRAM) or double data rate type five SDRAM (DDR5 SDRAM), the synchronization of command signals, such as read and write command signals, with an internal clock signal is desirable to facilitate proper operation of the memory device. More specifically, and as described in detail below, a delay-locked loop clock signal (LCLK) may be provided to a data (DQ) system for performing memory read operations. As appreciated, the additional capability provided by a delay-locked loop (DLL) and its associated distribution circuitry may utilize additional power. In designing components of memory devices to aid in command and clock synchronization, power consumption provides an additional factor that may be considered and reduced whenever possible, without reducing the efficacy of the memory device and synchronization of command signals in the memory device.

Techniques described herein may include descriptions of systems and/or methods for selectively providing a delay-locked loop clock signal to a DQ system to reduce power consumed by the DQ system. By combining logic to share amongst to multiple DQ pads, the overall complexity of the routing system for the DLL may be reduced, thus reducing overall power consumption of the DLL distribution circuitry. Furthermore, through this combination of logic of the DLL distribution circuitry, the amount of layout area used for DLL routing is reduced.

Figure 1:
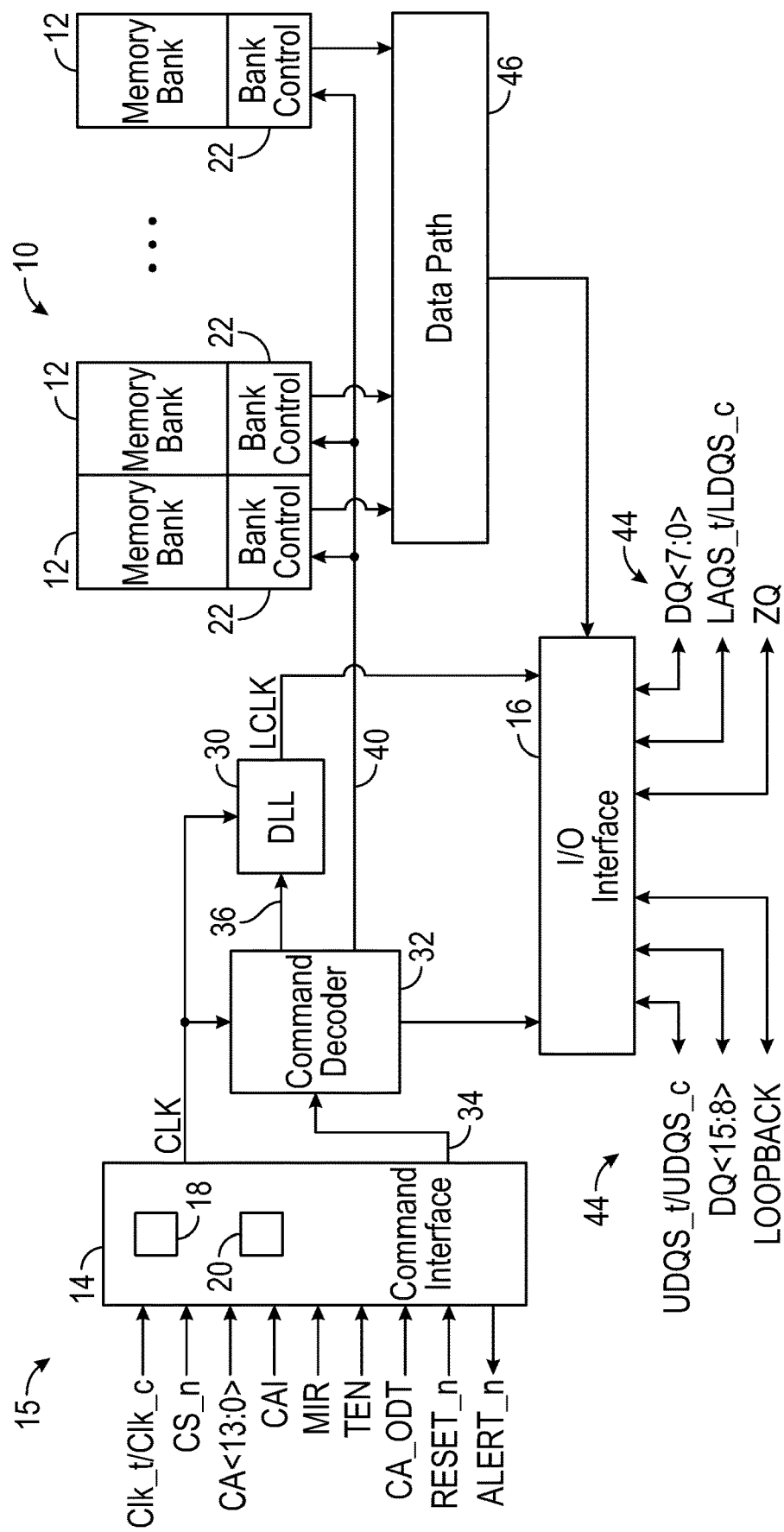
FIG. 1 is a simplified block diagram illustrating certain features of a memory device, according to an embodiment of the present disclosure.

Turning now to the figures, FIG. 1 is a simplified block diagram illustrating certain features of a memory device 10 which may be implemented in and/or coupled to a host device. Specifically, the block diagram of FIG. 1 is a functional block diagram illustrating certain functionality of the memory device 10. In accordance with one embodiment, the memory device 10 may be a DDR5 SDRAM device. Various features of DDR5 SDRAM allow for reduced power consumption, more bandwidth and more storage capacity compared to prior generations of DDR SDRAM.

The memory device 10, may include a number of memory banks 12. The memory banks 12 may be DDR5 SDRAM memory banks, for instance. The memory banks 12 may be provided on one or more chips (e.g., SDRAM chips) that are arranged on dual inline memory modules (DIMMS). Each DIMM may include a number of SDRAM memory chips (e.g., x8 or x16 memory chips), as will be appreciated. Each SDRAM memory chip may include one or more memory banks 12. The memory device 10 represents a portion of a single memory chip (e.g., SDRAM chip) having a number of memory banks 12. For DDR5, the memory banks 12 may be further arranged to form bank groups. For instance, for an 8 gigabyte (Gb) DDR5 SDRAM, the memory chip may include 16 memory banks 12, arranged into 8 bank groups, each bank group including 2 memory banks. For a 16 Gb DDR5 SDRAM, the memory chip may include 32 memory banks 12, arranged into 8 bank groups, each bank group including 4 memory banks, for instance. Various other configurations, organization and sizes of the memory banks 12 on the memory device 10 may be utilized depending on the application and design of the overall system.

The memory device 10 may include a command interface 14 and an input/output (I/O) interface 16. The command interface 14 is configured to provide a number of signals (e.g., signals 15) from an external device (not shown), such as a processor or controller. The processor or controller may provide various signals 15 to the memory device 10 to facilitate the transmission and receipt of data to be written to or read from the memory device 10.

As will be appreciated, the command interface 14 may include a number of circuits, such as a clock input circuit 18 and a command address input circuit 20, for instance, to ensure proper handling of the signals 15. The command interface 14 may receive one or more clock signals from an external device. Generally, double data rate (DDR) memory utilizes a differential pair of system clock signals, referred to herein as the true clock signal (Clk_t) and the bar clock signal (Clk_b). The positive clock edge for DDR refers to the point where the rising true clock signal Clk_t crosses the falling bar clock signal Clk_b, while the negative clock edge indicates that transition of the falling true clock signal Clk_t and the rising of the bar clock signal Clk_b. Commands (e.g., read command, write command, etc.) are typically entered on the positive edges of the clock signal and data is transmitted or received on both the positive and negative clock edges.

The clock input circuit 18 receives the true clock signal (Clk_t) and the bar clock signal (Clk_b) and generates an internal clock signal CLK. The internal clock signal CLK is supplied to an internal clock generator, such as a delay-locked loop (DLL) circuit 30. The DLL circuit 30 generates a phase controlled internal clock signal LCLK based on the received internal clock signal CLK. The phase controlled internal clock signal LCLK is supplied to the I/O interface 16, for instance, and is used as a timing signal for determining an output timing of read data.

The internal clock signal(s)/phases CLK may also be provided to various other components within the memory device 10 and may be used to generate various additional internal clock signals. For instance, the internal clock signal CLK may be provided to a command decoder 32. The command decoder 32 may receive command signals from the command bus 34 and may decode the command signals to provide various internal commands. For instance, the command decoder 32 may provide command signals to the DLL circuit 30 over the bus 36 to coordinate generation of the phase controlled internal clock signal LCLK. The phase controlled internal clock signal LCLK may be used to clock data through the I/O interface 16, for instance.

Further, the command decoder 32 may decode commands, such as read commands, write commands, mode-register set commands, activate commands, etc., and provide access to a particular memory bank 12 corresponding to the command, via the bus path 40. As will be appreciated, the memory device 10 may include various other decoders, such as row decoders and column decoders, to facilitate access to the memory banks 12. In one embodiment, each memory bank 12 includes a bank control block 22 which provides the necessary decoding (e.g., row decoder and column decoder), as well as other features, such as timing control and data control, to facilitate the execution of commands to and from the memory banks 12.

The memory device 10 executes operations, such as read commands and write commands, based on the command/address signals received from an external device, such as a processor. In one embodiment, the command/address bus may be a 14-bit bus to accommodate the command/address signals (CA<13:0>). The command/address signals are clocked to the command interface 14 using the clock signals (Clk_t and Clk_b). The command interface may include a command address input circuit 20 which is configured to receive and transmit the commands to provide access to the memory banks 12, through the command decoder 32, for instance. In addition, the command interface 14 may receive a chip select signal (CS_n). The CS_n signal enables the memory device 10 to process commands on the incoming CA<13:0>bus. Access to specific memory banks 12 within the memory device 10 is encoded on the CA<13:0>bus with the commands.

In addition, the command interface 14 may be configured to receive a number of other command signals. For instance, a command/address on die termination (CA_ODT) signal may be provided to facilitate proper impedance matching within the memory device 10. A reset command (RESET n) may be used to reset the command interface 14, status registers, state machines and the like, during power-up for instance. The command interface 14 may also receive a command/address invert (CAI) signal which may be provided to invert the state of command/address signals CA<13:0> on the command/address bus, for instance, depending on the command/address routing for the particular memory device 10. A mirror (MIR) signal may also be provided to facilitate a mirror function. The MIR signal may be used to multiplex signals so that they can be swapped for enabling certain routing of signals to the memory device 10, based on the configuration of multiple memory devices in a particular application. Various signals to facilitate testing of the memory device 10, such as the test enable (TEN) signal, may be provided, as well. For instance, the TEN signal may be used to place the memory device 10 into a test mode for connectivity testing.

The command interface 14 may also be used to provide an alert signal (ALERT_n) to the system processor or controller for certain errors that may be detected. For instance, an alert signal (ALERT_n) may be transmitted from the memory device 10 if a cyclic redundancy check (CRC) error is detected. Other alert signals may also be generated. Further, the bus and pin for transmitting the alert signal (ALERT_n) from the memory device 10 may be used as an input pin during certain operations, such as the connectivity test mode executed using the TEN signal, as described above.

Data may be sent to and from the memory device 10, utilizing the command and clocking signals discussed above, by transmitting and receiving data signals 44 through the I/O interface 16. More specifically, the data may be sent to or retrieved from the memory banks 12 over the datapath 46, which includes a plurality of bi-directional data buses. Data IO signals, generally referred to as DQ signals, are generally transmitted and received in one or more bi-directional data busses. For certain memory devices, such as a DDR5 SDRAM memory device, the IO signals may be divided into upper and lower bytes. For instance, for an ×16 memory device, the IO signals may be divided into upper and lower IO signals (e.g., DQ<15:8> and DQ<7:0>) corresponding to upper and lower bytes of the data signals.

Other configurations, for example an ×8 memory device may include IO signals (e.g., DQ<7:0>) that correspond to the bytes of the data signals.

To allow for higher data rates within the memory device 10, certain memory devices, such as DDR memory devices may utilize data strobe signals, generally referred to as DQS signals. The DQS signals are driven by the external processor or controller sending the data (e.g., for a write command) or by the memory device 10 (e.g., for a read command). For read commands, the DQS signals are effectively additional data output (DQ) signals with a predetermined pattern. For write commands, the DQS signals are used as clock signals to capture the corresponding input data. As with the clock signals (Clk_t and Clk_b), the DQS signals may be provided as a differential pair of data strobe signals (DQS_t and DQS_b) to provide differential pair signaling during reads and writes. For certain memory devices, such as a DDR5 SDRAM memory device, the differential pairs of DQS signals may be divided into upper and lower data strobe signals (e.g., UDQS_t and UDQS_b; LDQS_t and LDQS_b) corresponding to upper and lower bytes of data sent to and from the memory device 10, for instance.

As illustrated in FIG. 1, an impedance (ZQ) calibration signal may also be provided to the memory device 10 through the I/O interface 16. The ZQ calibration signal may be provided to a reference pin and used to tune output drivers and ODT values by adjusting pull-up and pull-down resistors of the memory device 10 across changes in process, voltage and temperature (PVT) values. Because PVT characteristics may impact the ZQ resistor values, the ZQ calibration signal may be provided to the ZQ reference pin to be used to adjust the resistance to calibrate the input impedance to known values. As will be appreciated, a precision resistor is generally coupled between the ZQ pin on the memory device 10 and GND/VSS external to the memory device 10. This resistor acts as a reference for adjusting internal ODT and drive strength of the IO pins.

In addition, a loopback signal (LOOPBACK) may be provided to the memory device 10 through the I/O interface 16. The loopback signal may be used during a test or debugging phase to set the memory device 10 into a mode wherein signals are looped back through the memory device 10 through the same pin. For instance, the loopback signal may be used to set the memory device 10 to test the data output (DQ) of the memory device 10. Loopback may include both a data and a strobe or possibly just a data pin. This is generally intended to be used to monitor the data captured by the memory device 10 at the I/O interface 16.

As will be appreciated, various other components such as power supply circuits (for receiving external VDD and VSS signals), mode registers (to define various modes of programmable operations and configurations), read/write amplifiers (to amplify signals during read/write operations), temperature sensors (for sensing temperatures of the memory device 10), etc., may also be incorporated into the memory device 10. Accordingly, it should be understood that the block diagram of FIG. 1 is only provided to highlight certain functional features of the memory device 10 to aid in the subsequent detailed description.

Figure 2:
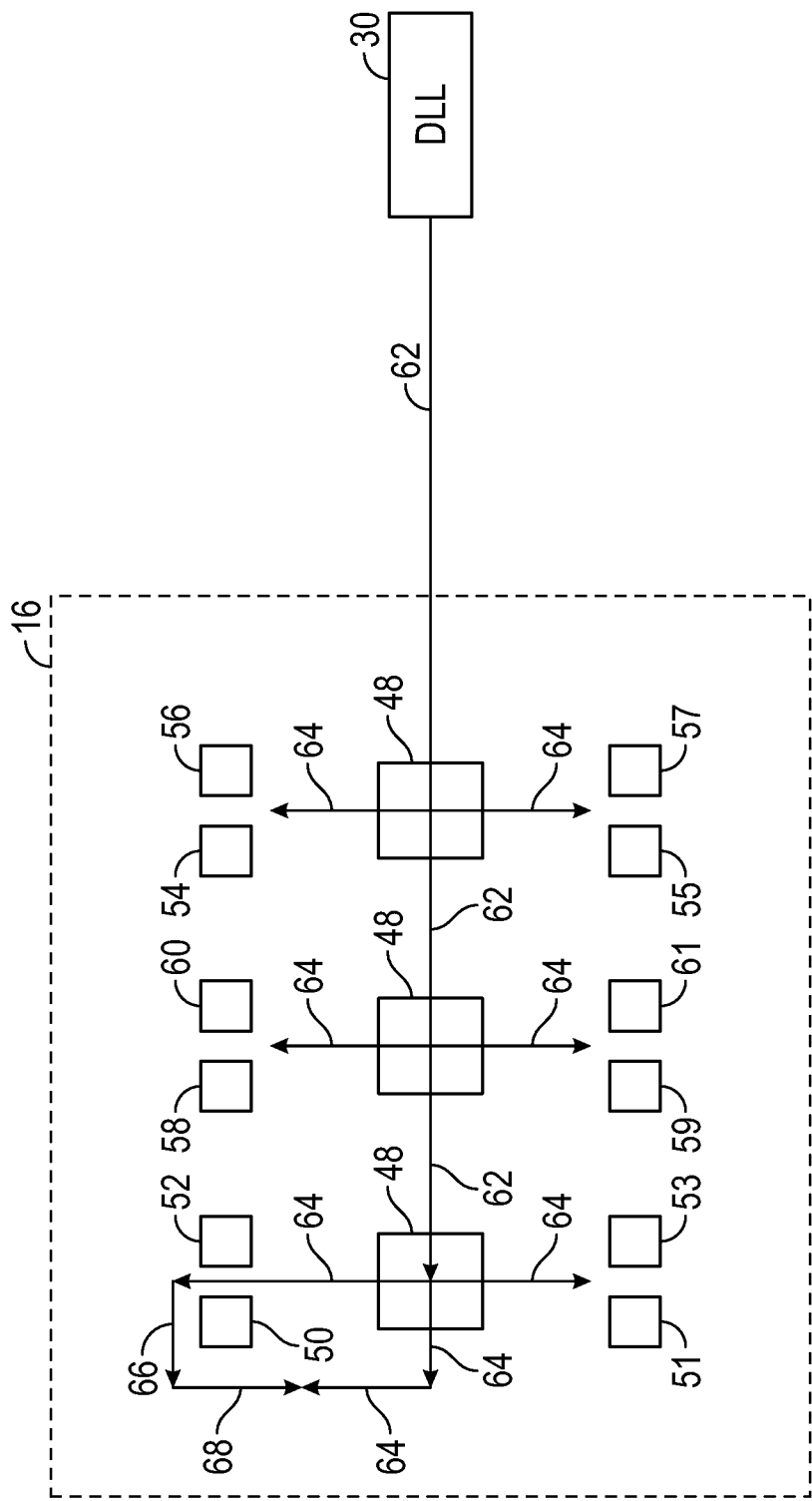
FIG. 2 is a schematic diagram illustrating a portion of the I/O interface of FIG. 1, according to an embodiment of the present disclosure.

Keeping this in mind, FIG. 2 illustrates a block diagram of the DLL circuit 30 and the I/O interface 16 inclusive of a set of DQ systems 48 (e.g., signal transmission circuitry used to generate and/or transmit signals that assist with, facilitate, and/or are used in conjunction with the transmission of data from the I/O interface 16). As illustrated, the I/O interface 16 also includes DQ pads 50-57 (i.e., connections or contact points). As illustrated the DQ pads 50-57 operate to receive 10 signals DQ<7:0>, whereby DQ pad 50 corresponds to DQ0, DQ pad 51 corresponds to DQ1, DQ pad 52 corresponds to DQ2, DQ pad 53 corresponds to DQ3, DQ pad 54 corresponds to DQ4, DQ pad 55 corresponds to DQ5, DQ pad 56 corresponds to DQ6, and DQ pad 57 corresponds to DQ7. Likewise, the I/O interface 16 includes DQS pads 58-61 that operate to receive DQS signals.

Additionally illustrated is a global DLL line 62 as well as local DLL lines 64. The global DLL line 62 transmits LCLK to the I/O interface 16. The local DLL lines 64 represent pathways that transmit clock signals from the DQ systems 48 to be utilized in conjunction with the DQ pads 50-57 (e.g., to mux data out), the DQS pads 58-61, and in latching read enable (QED) signals. A data first-in first-out (FIFO) path 66 is illustrated atop DQ pads 50. The FIFO path 66 may include or may be coupled to a FIFO circuit of the memory device 10 and receives data from the memory banks 12 and passes that data to a host device and utilizes both the signals from a local DLL line 64 as well as the QED signals to latch the data. This latched data is output from the FIFO path 66 down a side of DQ pad 50 along data path 68 to be clocked out via a DQ multiplexer that additionally uses a signal received from a local DLL line 64. In this manner, the local DLL lines 64 transmit signals utilized in read operations of the memory device 10.

Figure 3:
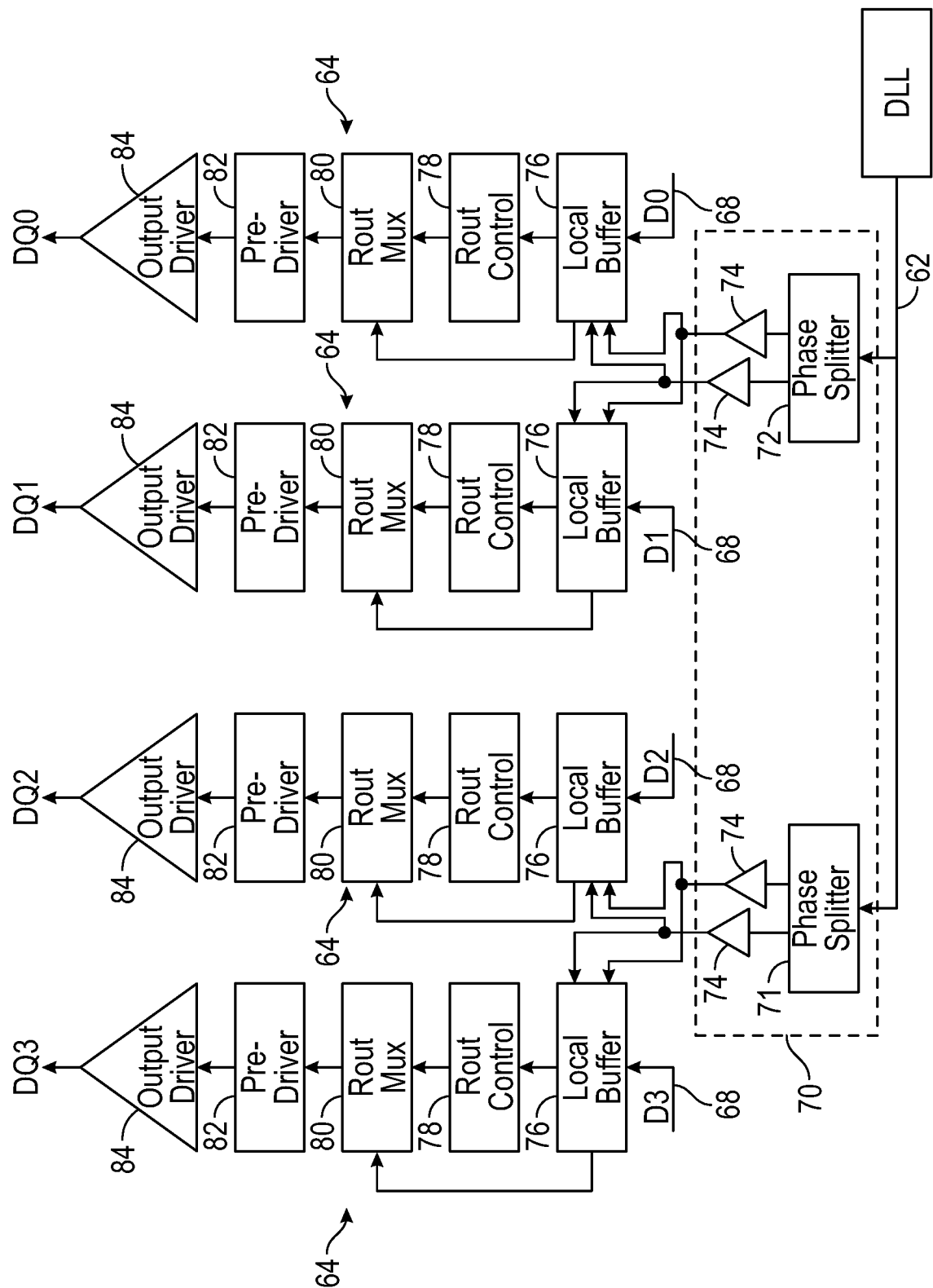
FIG. 3 is schematic diagram of a first embodiment of the DQ system of FIG. 2, in accordance with an embodiment.

The DQ systems 48 transmit clock signals to their respective corresponding DQ pads 50-53, corresponding DQ pads 54-57, and corresponding DQS pads 58-61 (along with transmission to the associated FIFO path 66 and DQ multiplexer). FIG. 3 discussed below discloses one embodiment of the DQ system 48 that can be utilized to transmit clock signals along the local DLL lines 64.

The memory device 10 operates with clock cycles up to and including 5200 MHz, 6200 MHz, 6400 MHz, and/or frequencies higher than 6400 MHz. To facilitate these speeds, the memory device 10 includes the DLL circuit 30, as previously discussed, that transmits the LCLK to the respective DQ systems 48. One embodiment of the DQ system 48 of FIG. 2 is illustrated as DQ system 70 in FIG. 3. The DQ system 70, as illustrated in FIG. 3, is coupled to and corresponds to DQ pads 50-53. As illustrated, the DQ system 70 includes a phase splitter 71 and a phase splitter 72. The phase splitter 71 operates to generate a first clock signal (LCK1) and a second clock signal (LCK2) having 180° difference in phase from one another, whereby the LCK1 and the LCK2 are based on the input clock (LCK) transmitted from the DLL circuit 30 along the global DLL line 62. The LCK1 and the LCK2 are each transmitted to a respective clock driver 74, which may operate to buffer and/or reduce jitter in the LCK1 and LCK2. Thereafter, LCK1 and LCK2 are each transmitted to local DLL lines 64 that correspond to DQ pad 52 and DQ pad 53.

As illustrated, each of the local DLL lines 64 can include a local buffer 76 that operates to buffer (e.g., delay) the transmission of, for example, data (e.g. D2 and D3, respectively) to the host device via the respective DQ pads 52 and 53. Additionally illustrated is control circuitry 78 that operates to control the transmission of data to the host device. For example, the control circuitry 78 may generate a control signal to control operation of the multiplexer 80 in each local DLL line 64. Additionally illustrated are a pre-driver circuit 82 and an output driver 84 that operate to transmit the DQ2 signal from the DQ2 pad 52 and the DQ3 signal from the DQ3 pad 53. The LCK1 may be transmitted from an output of the DQ system 70 to each of the local DLL lines 64 for use by one or more of the local buffer 76, the control circuitry 78, the multiplexer 80, the pre-driver circuit 82, and the output driver 84 that correspond to each of the DQ2 pad 52 and the DQ3 pad 53 to drive read data (e.g., D2 and D3) as the DQ2 signal and the DQ3 signal. Similarly, the LCK2 may be transmitted from an output of the DQ system 70 to each of the local DLL lines 64 for use by one or more of the local buffer 76, the control circuitry 78, the multiplexer 80, the pre-driver circuit 82, and the output driver 84 that correspond to each of the DQ2 pad 52 and the DQ3 pad 53 to drive read data (e.g., D2 and D3) as the DQ2 signal and the DQ3 signal.

The second phase splitter 72 also operates to generate the first clock signal (LCK1) and the second clock signal (LCK2) having 180° difference in phase from one another, whereby the LCK1 and the LCK2 are based on the input clock (LCK) transmitted from the DLL circuit 30 along the global DLL line 62. The LCK1 and the LCK2 are each transmitted to a respective clock driver 74, which may operate to buffer and/or reduce jitter in the LCK1 and LCK2. Thereafter, LCK1 and LCK2 are each transmitted to local DLL lines 64 that correspond to DQ pad 50 and DQ pad 51.

As illustrated, each of the local DLL lines 64 can include a local buffer 76 that operates to buffer (e.g., delay) the transmission of, for example, data (e.g. D0 and D1, respectively) to the host device via the respective DQ pads 50 and 51. Additionally illustrated is control circuitry 78 that operates to control the transmission of data to the host device. For example, the control circuitry 78 may generate a control signal to control operation of the multiplexer 80 in each local DLL line 64. Additionally illustrated are a pre-driver circuit 82 and an output driver 84 that operate to transmit the DQ0 signal from the DQ0 pad 50 and the DQ1 signal from the DQ1 pad 51. The LCK1 may be transmitted from an output of the DQ system 70 to each of the local DLL lines 64 for use by one or more of the local buffer 76, the control circuitry 78, the multiplexer 80, the pre-driver circuit 82, and the output driver 84 that correspond to each of the DQ0 pad 50 and the DQ1 pad 51 to drive read data (e.g., D0 and D1) as the DQ0 signal and the DQ1 signal. Similarly, the LCK2 may be transmitted from an output of the DQ system 70 to each of the local DLL lines 64 for use by one or more of the local buffer 76, the control circuitry 78, the multiplexer 80, the pre-driver circuit 82, and the output driver 84 that correspond to each of the DQ0 pad 50 and the DQ1 pad 51 to drive read data (e.g., D0 and D1) as the DQ0 signal and the DQ1 signal.

Figure 4:
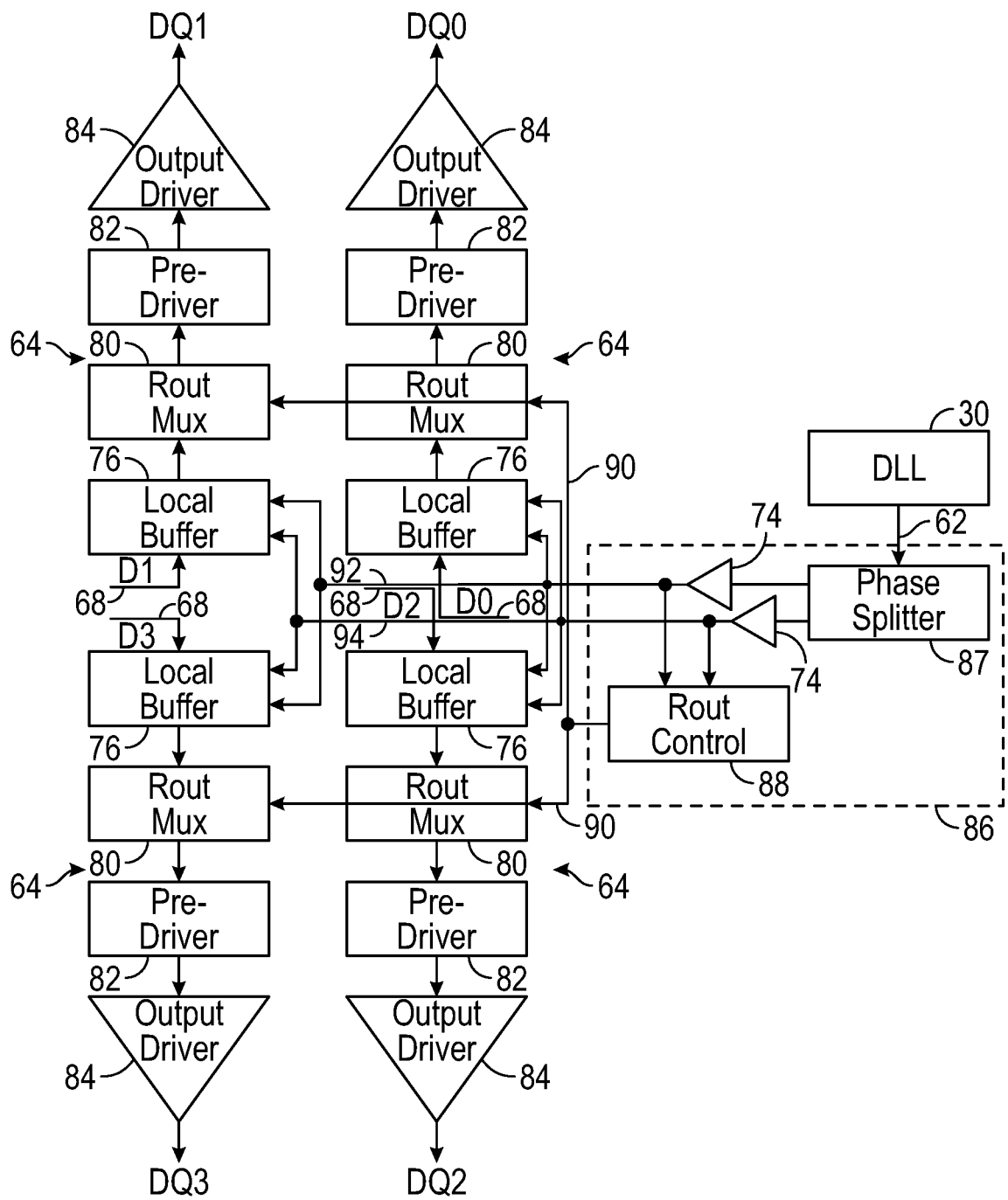
FIG. 4 is a schematic diagram of a second embodiment of the DQ system of FIG. 2, in accordance with an embodiment.

A second embodiment of the DQ system 48 of FIG. 2 is illustrated as DQ system 86 in FIG. 4. The DQ system 86, as illustrated in FIG. 4, is coupled to and corresponds to DQ pads 50-53. As illustrated the DQ system 86 (e.g., a signal transmission circuit or signal transmission circuitry) includes an input (e.g., a pin, terminal, or the like) coupled to the global DLL line 62. When the DQ system 86 is in operation, the input receives (e.g., when in operation) the LCK from the DLL circuit 30. The DQ system 86 also includes a phase splitter 87. The phase splitter 87, when in operation, generates a first clock signal (LCK1) and a second clock signal (LCK2) having 180° difference in phase from one another, whereby the LCK1 and the LCK2 are based on the input clock (LCK) transmitted from the DLL circuit 30 along the global DLL line 62. The LCK1 and the LCK2 are each transmitted to a respective clock driver 74, which, when in operation, buffer and/or reduce jitter in the LCK1 and LCK2.

Additionally, LCK1 and LCK2 are each transmitted to control circuitry 88 of the DQ system 86 as clocking signals for the control circuitry 88. The control circuitry 88, when in operation, controls the transmission of data (i.e., read data D0, D1, D2, and D3) to the host device for example by generating control signals utilizing the LCK1 and/or the LCK2 and transmitting the control signals to the respective multiplexers 80 of the local DLL lines 64. Finally, the DQ system 86 includes three outputs (e.g., pins, terminals, or the like). A first output of the DQ system 86 is coupled to a control path 90 and when the DQ system 86 is in operation, the first output transmits (e.g., when it is in operation) the one or more of the control signals generated by the control circuitry 88 to each of the multiplexers 80 in their respective local DLL lines 64. A second output of the DQ system 86 is coupled via a clock path 92 to each of the local DLL lines 64 that correspond to DQ pads 50-53. A third output of the DQ system 86 is coupled via a clock path 94 to each of the local DLL lines 64 that correspond to DQ pads 50-53. When the DQ system 86 is in operation, the second output transmits (e.g., when in operation) LCK1 while the third output transmits (e.g., when in operation) LCK2 or vice versa. In this manner, each of clock path 92 and clock path 94 convey one of the generated clock signals from the DQ system 86 to each of the local DLL lines 64 for use therein to drive read data (e.g., D0, D1, D2, and D3) as the DQ0 signal, the DQ1 signal, the DQ2 signal, and the DQ3 signal.

As illustrated, each of the local DLL lines 64 can include a local buffer 76 that operates to buffer (e.g., delay) the transmission of, for example, data (e.g., read data D0, D1, D2, and D3) to the host device via the respective DQ pads 50-53. Additionally each of the local DLL lines 64 includes a multiplexer 80 (e.g., a DQMUX) that is controlled by a respective control signal generated by the control circuitry 88 and that operates to selectively transmit data to a pre-driver circuit 82 coupled thereto. Additionally illustrated is the pre-driver circuit 82 and an output driver 84 for each local DLL line 64. These pre-driver circuits 82 and output drivers 84 for each local DLL line 64 operate to transmit a respective DQ0 signal from the DQ0 pad 50, DQ1 signal from the DQ1 pad 51, DQ2 signal from the DQ2 pad 52, and DQ3 signal from the DQ3 pad 53. The LCK1 may be transmitted from an output (e.g., the second output) of the DQ system 86 to each of the local DLL lines 64 for use by one or more of the local buffer 76, the multiplexer 80, the pre-driver circuit 82, and the output driver 84 that correspond to each of the DQ0 pad 50, the DQ1 pad 51, the DQ2 pad 52, and the DQ3 pad 53 to drive read data (e.g., D0, D1, D2, and D3) as the DQ0 signal, the DQ1 signal, the DQ2 signal, and the DQ3 signal. Similarly, the LCK2 may be transmitted from an output (e.g., the third output) of the DQ system 86 to each of the local DLL lines 64 for use by one or more of the local buffer 76, the control circuitry 78, the multiplexer 80, the pre-driver circuit 82, and the output driver 84 that correspond to each of the DQ0 pad 50, the DQ1 pad 51, the DQ2 pad 52, and the DQ3 pad 53 to drive read data (e.g., D0, D1, D2, and D3) as the DQ0 signal, the DQ1 signal, the DQ2 signal, and the DQ3 signal.

Use of the DQ system 86 of FIG. 4 in place of the DQ system 70 in FIG. 3 may provide advantages both in power consumption as well as in layout area. For example, the DQ control logic (control circuitry 88 of the DQ system 86) for the four DQ pads 50-53 is centered and combined into a single unit. Additionally, through the combining of logic in the DQ system 86 (i.e., control circuitry 88 in place of control circuitry 78, phase splitter 87 into a single unit in place of phase splitter 71 and phase splitter 72, and a reduced number of clock drivers 74) and by and matching local DLL clocks and QED signal propagations, setup and hold times for both the FIFO and DQMUX are reduced. Furthermore, the distribution of the clock drivers 74 in the DQ system 86 at a single location coupled to the phase splitter 87 reduces programmable delays, resulting in a reduction in forward path gate counts and less PVT (pressure, voltage, temperature) variations and improved power supply sensitivity.

Moreover, having four DQ pads 50-53 sharing DLL clocks (LCK1 and LCK2), as illustrated in FIG. 4 in place of two DQ pads 50 and 51 sharing DLL clocks (LCK1 and LCK2) and two DQ pads 52 and 53 sharing DLL clocks (LCK1 and LCK2), as illustrated in FIG. 3, aids in reducing by half the gate loadings on the global DLL line 62. Additionally, the embodiment of FIG. 4 reduces distances for the LCK on the global DLL line 62 and the distances for the LCK1 and LCK2 through the illustrated layout (i.e., global DLL clock LCK in center; FIFO on top of a bond pad (e.g., FIFO path 66); data meets local DLL clocks at center (e.g., data path 68)). This minimizes the distance on both global and local DLL clocks, which allows for sharing drivers to the top pads (e.g., DQ0 pad 50 and DQ1 pad 51) and the bottom pads (e.g., DQ2 pad 52 and DQ3 pad 53) and, accordingly, reduces the number of switching gates by half with respect to the embodiment in FIG. 3. Indeed, based on the type of memory chip (e.g., an ×4 or ×8 or ×16 memory chip), power savings may be, for example, approximately 10 mA, 20 mA, 40 mA, or another amount (depending on the type of memory chip). Furthermore, the localization accomplished in the DQ system 86 allows for fewer local DLL stages used to latch QED signals and, accordingly saves power (i.e., a majority of power savings occurs subsequent to the phase splitter 87).

While the present disclosure may be susceptible to various modifications and alternative forms, specific embodiments have been shown by way of example in the drawings and have been described in detail herein. However, it should be understood that the present disclosure is not intended to be limited to the particular forms disclosed. Rather, the present disclosure is intended to cover all modifications, equivalents, and alternatives falling within the spirit and scope of the present disclosure as defined by the following appended claims.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). However, for any claims containing elements designated in any other manner, it is intended that such elements are not to be interpreted under 35 U.S.C. 112(f).

What is claimed is:

1. An apparatus, comprising:
a memory device interface comprising a first data output, a second data output, a third data output, and a fourth data output, wherein the memory device interface comprises a first path corresponding to the first data output, a second path corresponding to the second data output, a third path corresponding to the third data output, and a fourth path corresponding to the fourth data output; and
a signal transmission circuit comprising a first output that when in operation transmits a first clock signal to the first path, the second path, the third path, and the fourth path and a second output that when in operation transmits a second clock signal to the first path, the second path, the third path, and the fourth path.

2. The apparatus of claim 1, wherein the signal transmission circuit comprises an input coupled to a global delay-locked loop (DLL) path, wherein the input when in operation receives a DLL clock signal.

3. The apparatus of claim 2, wherein the signal transmission circuit comprises a phase splitter coupled to the input to receive the DLL clock signal from the input.

4. The apparatus of claim 3, wherein the phase splitter when in operation generates the first clock signal and the second clock signal based on the DLL clock signal.

5. The apparatus of claim 4, wherein the phase splitter when in operation generates the first clock signal and the second signal as having a 180° difference in phase from one another.

6. The apparatus of claim 4, wherein the signal transmission circuit comprises a control circuit that when in operation receives each of the first clock signal and the second clock signal from the phase splitter.

7. The apparatus of claim 6, wherein the signal transmission circuit comprises a third output coupled to the control circuit and the first path, the second path, the third path, and the fourth path.

8. The apparatus of claim 7, wherein the control circuit when in operation generates a plurality of control signals based upon at least one of the first clock signal and the second clock signal and transmits at least one control signal of the plurality of control signals to the first path, the second path, the third path, and the fourth path.

9. The apparatus of claim 1, wherein the signal transmission circuit is physically disposed in an area central to the first data output, the second data output, the third data output, and the fourth data output.

10. The apparatus of claim 9, wherein the memory device interface comprises a first-in first-out path disposed in a region above the first data output, wherein the area central to the first data output, the second data output, the third data output, and the fourth data output is disposed below the first data output and below the region.

11. The apparatus of claim 10, wherein the memory device interface comprises a data path in a second region along a first side of the first data output, wherein the second region is disposed below the region above the first data output and above the area central to the first data output, the second data output, the third data output, and the fourth data output.

12. A method, comprising:
receiving a delay-locked loop (DLL) clock signal;
generating a first clock signal based upon the DLL clock signal;
transmitting, from an output, the first clock signal along a first pathway that corresponds to a first data (DQ) pad of a memory device;
transmitting, from the output, the first clock signal along a second pathway that corresponds to a second DQ pad of the memory device;
transmitting, from the output, the first clock signal along a third pathway that corresponds to a third DQ pad of the memory device;
transmitting, from the output, the first clock signal along a fourth pathway that corresponds to a fourth DQ pad of the memory device; and
executing a data read from the memory device utilizing at least one of the first DQ pad, the second DQ pad, the third DQ pad, and the fourth DQ pad to transfer data to a host device coupled to the memory device.

13. The method of claim 12, comprising generating a second clock signal based upon the DLL clock signal.

14. The method of claim 13, wherein the second clock signal is generated as having a 180° difference in phase relative to the first clock signal.

15. The method of claim 13, comprising:
transmitting, from a second output, the second clock signal along the first pathway that corresponds to the first DQ pad of the memory device;
transmitting, from the second output, the second clock signal along the second pathway that corresponds to the second DQ pad of the memory device;
transmitting, from the second output, the second clock signal along the third pathway that corresponds to the third DQ pad of the memory device; and
transmitting, from the second output, the second clock signal along the fourth pathway that corresponds to the fourth DQ pad of the memory device.

16. The method of claim 15, comprising generating a control signal based at least in part on one of the first clock signal and the second clock signal.

17. The method of claim 16, comprising transmitting the control signal to at least one of the first pathway, the second pathway, the third pathway, and the fourth pathway.

18. A device, comprising:
a first input coupled to a delay-locked loop (DLL) circuit, wherein when the device is in operation, the first input receives a DLL clock from the DLL circuit;
a phase splitter coupled to the first input, wherein when the device is in operation, the phase splitter generates a first clock signal and a second clock signal based on the DLL clock;
a control circuit coupled to the phase splitter, wherein when the device is in operation, the control circuit generates a plurality of control signals based upon at least one of the first clock signal and the second clock signal;
a first output coupled to the control circuit, wherein when the device is in operation, the first output transmits at least one control signal of the plurality of control signals;
a second output coupled to the phase splitter, wherein when the device is in operation, the second output transmits the first clock signal from the device; and
a third output coupled to the phase splitter, wherein when the device is in operation, the third output transmits the second clock signal from the device.

19. The device of claim 18, comprising a clock driver disposed between the phase splitter and the second output, wherein when the device is in operation, the clock driver reduces jitter in the first clock signal.

20. The device of claim 19, wherein the clock driver is disposed between the phase splitter and the control circuit.

* * * * *